United States Patent [19]

Kawamoto et al.

[11] 4,027,179

[45] May 31, 1977

[54] HIGH REPETITION RATE INJECTION LASER MODULATOR

[75] Inventors: Hirohisa Kawamoto, Kendall Park, N.J.; David Joseph Miller, III, Philadelphia, Pa.

[73] Assignee: RCA Corporation, New York, N.Y.

[22] Filed: Aug. 28, 1975

[21] Appl. No.: 608,513

[52] U.S. Cl. .................. 307/296 R; 307/300; 307/305; 357/13; 331/94.5 H
[51] Int. Cl.² ............................................ H03K 1/18
[58] Field of Search ............ 357/13; 307/296, 300, 307/305; 331/94.5 H

[56] References Cited
UNITED STATES PATENTS

| | | | |
|---|---|---|---|
| 3,586,884 | 6/1971 | Gassmann | 307/300 |
| 3,609,396 | 9/1971 | Gassmann | 307/300 |
| 3,638,042 | 1/1972 | Studtmann | 307/305 |
| 3,855,605 | 12/1974 | Kawamoto | 357/13 |

Primary Examiner—Andrew J. James
Assistant Examiner—Joseph E. Clawson, Jr.
Attorney, Agent, or Firm—Edward J. Norton; Joseph D. Lazar

[57] ABSTRACT

A high repetition rate injection laser modulator wherein a DC bias voltage is applied across a serially connected forwardly-poled-injection laser and carrier-injected avalanche device. The carrier-injected avalanche device generates a current pulse in response to additional carriers injected into the device by a trigger pulse applied across the control junction of the avalanche device. An offset bias is provided across the control junction to remove built-up charges at the junction interface to provide for high repetition rate operation. The current pulse is of sufficient magnitude to effect pumping of the injection laser, the injection laser thus emitting a corresponding pulse of coherent light.

3 Claims, 4 Drawing Figures

U.S. Patent
May 31, 1977
4,027,179
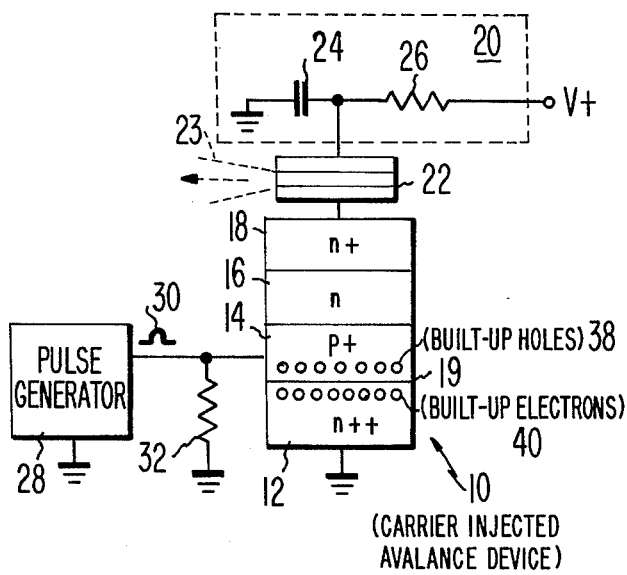
PRIOR ART
Fig.1
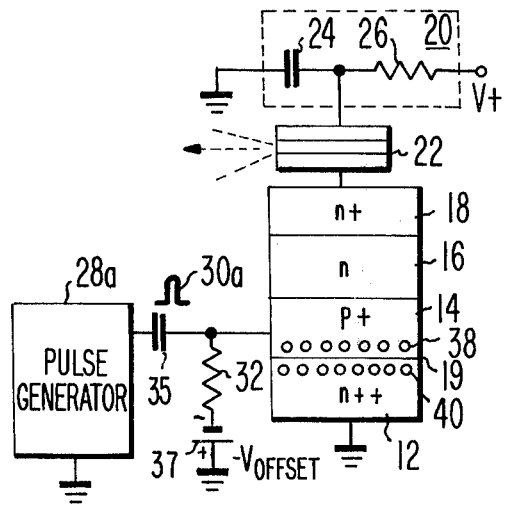
Fig.3
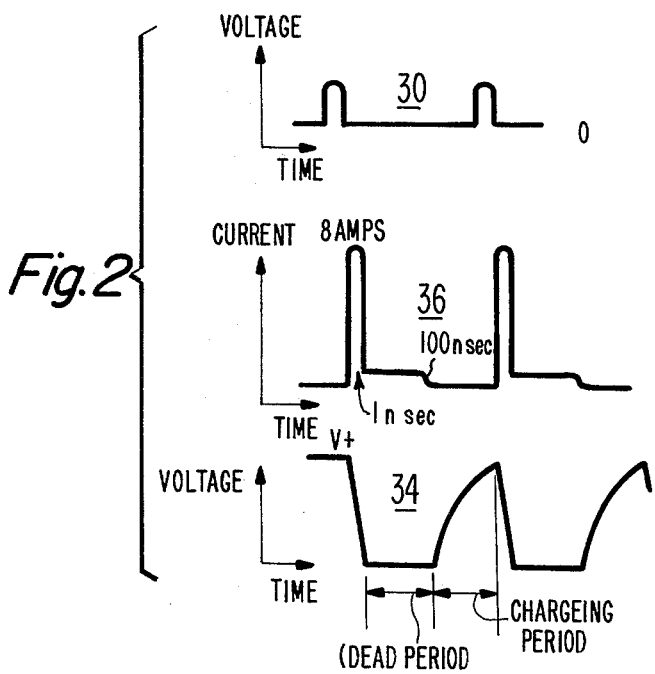
PRIOR ART
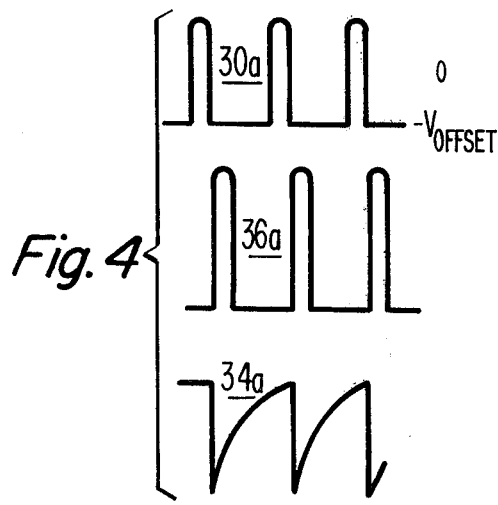
Fig.4

HIGH REPETITION RATE INJECTION LASER MODULATOR

CROSS REFERENCES TO RELATED APPLICATIONS

Of interest is application Ser. No. 524,757 now U.S. Pat. No. 3,953,809 entitled "Nanosecond Modulation of Injection Laser" filed on Nov. 18, 1974 by H. Kawamoto and D. J. Miller, assigned to the assignee of the present invention.

BACKGROUND OF THE INVENTION

1. Field of the Invention

The present invention is directed to a technique for high repetition rate operation of a carrier-injected avalanche device, and, specifically, to a biasing technique for a carrier injected avalanche device which generates a current pulse in response to the injection carriers, to drive an injection laser connected in series with the avalanche device.

2. Description of the Prior Art

U.S. Pat. No. 3,855,605 issued Dec. 17, 1974 to H. Kawamoto is directed to a carrier injected avalanche device. As described therein, the carrier injected avalanche device comprises a two terminal avalanche diode having at least first, second and third crystalline semiconductor layers. The first and third layers are of a highly doped semiconductor material and form junctions with the second layer which is of a lightly doped semiconductor material. The type of doping in the second layer is the same as that of the third layer but different from that of the first layer. A fourth layer may be used if desired, forming an additional junction with the first layer and has the same type of doping as the second layer. In operation, a reverse bias signal having a magnitude less than a predetermined threshold level, is applied across the avalanche diode terminal. The bias signal is chosen to be insufficient, in itself, to establish the critical magnitude of electric field within the device causing avalanche breakdown in the diode. However, the injection of external carriers into the second semiconductor layer increases the level of the electric field so as to cause avalanche breakdown to occur. As noted in that patent (U.S. Pat. No. 3,855,605) such a carrier injected avalanche device is capable of generating output voltage pulses having a duration of only about 5 nanoseconds.

Copending application Ser. No. 524,757 now U.S. Pat. No. 3,953,809 entitled "Nanosecond Modulation of Injection Laser," filed by the present inventors on Nov. 18, 1974 describes, in general, a pulse generator utilizing a carrier injected avalanche device such as described in the above-mentioned U.S. Pat. No. 3,855,605 to H. Kawamoto, and specifically, an injection laser modulator utilizing a carrier injected avalanche device.

SUMMARY OF THE INVENTION

The present invention is directed to a carrier injected avalanche device pulse generator, wherein biasing means are connected across what may be termed the control junction, of the device, i.e. the junction between the fourth and first layers, to dissipate substantially instantaneously, carrier build-up in the vicinity of the control junction caused by the plasma, current to facilitate thereby high repetition rate operation.

BRIEF DESCRIPTION OF THE DRAWING

FIG. 1 is a schematic of a prior art injection laser modulator.

FIG. 2 is a diagram of various waveforms of signals associated with the prior art laser modulator of FIG. 1.

FIG. 3 is a schematic of a laser injection modulator in accordance with the present invention.

FIG. 4 is a diagram of the waveforms of various signals associated with the laser modulator of FIG. 3.

DETAILED DESCRIPTION OF THE PREFERRED EMBODIMENT

Before proceeding to the description of the embodiment of the present invention, the problems attending the prior art will first be discussed.

A prior art injection laser modulator, such as described in the above-mentioned copending application Ser. No. 524,757 now U.S. Pat. 3,953,809 by the present inventors, is shown in FIG. 1. A carrier injected avalanche device 10 is reverse biased through a serially-connected forwardly-poled injection laser diode 22, suitably a GaAlAs double hetrojunction laser. The output current pulse of the carrier injected avalanche device 10 is large enough to pump injection laser 22, thereby causing injection laser 22 to emit a corresponding pulse of coherent light 23. Carrier injected avalanche device 10 consists of successive layers of crystalline semiconductor material 12, 14, 16 and 18. The respective layers are doped as follows: layer 12 is very highly doped with N type material ($N^{++}$); layer 14 is doped with P type material ($P^+$); layer 16 is lightly doped with N type material (N); and layer 18 is doped with N type material at a concentration ($N^+$) intermediate to the doping concentration of first layer 12 and third layer 16. It should be noted that a complementary device wherein the doping of the respective layers 12, 14 16 and 18 are $P^{++}$, $N^+$, P, $P^+$, will serve as an alternative device if desired.

Layers 14, 16 and 18 correspond to the first, second and third layers of the carrier injected avalanche device disclosed in the aforementioned U.S. Pat. No. 3,855,605. $N^{++}$ layer 12 corresponds to the fourth layer, discussed above, in connection with U.S. Pat. No. 3,855,605. Layers 14, 16 and 18 form, in themselves, a three layer trapatt punch-through diode with a typical trapatt impurity profile ($P^+$-N-$N^+$). The junction 19 between $P^+$ layer 14 and $N^{++}$ layer 12 is utilized as a control junction across which a voltage pulse 30 is applied, thereby to inject carriers from $N^{++}$ layer 12 through $P^+$ layer 14 into N layer 16. The $P^+$-N-$N^+$ junctions formed by layers 14, 16 and 18, if reverse biased near, but just below, avalanche breakdown, are triggered by the carriers injected into N region 16 to produce a trapped plasma. Thus, by applying an external voltage across junction 19, thereby injecting carriers into N layer 16, the diode is made to operate as a carrier injected avalanche device, generating a relatively large amplitude output current pulse in response to the injection of the external carriers. Carrier injected avalanche device 10 as described, is capable of producing an output current pulse having a duration of about only 1 nanosecond.

As further shown in FIG. 1, a positive voltage, with respect to ground is applied to reverse bias carrier injected avalanche device 10, from a charge supply circuit 20, through forwardly-poled injection laser 22 to $N^+$ layer 18 of the carrier injected avalanche device 10. Charge supply circuit 20 typically includes a charge storage device, such as a capacitor 24, which is charged to a positive voltage $V^+$ by suitable charging circuitry, such as resistor 26. The maximum biasing voltage $V^+$ is chosen to be just insufficient, in itself, to cause avalanche breakdown in device 10. $N^{++}$ layer 12 of device 10 is connected to ground. A pulse generator 28 applies the voltage pulse 30 across control junction 19. A resistor 32 is shunted across junction 19 to ground. Voltage pulse 30 is of sufficient magnitude, such as 0.6 volt, to inject sufficient carriers across control junction 19 to trigger a trapped plasma in N layer 16 of the carrier injected avalanche device 10.

In operation, carrier injected avalanche device 10 remains in a high impedance state (virtual open circuit) despite the presence of the applied direct current bias voltage 34 (see FIG. 2) thereacross from charge supply circuit 20, until sufficient carriers have been injected into N layer 16 in response to the application of the leading edge of pulse 30 across control junction 19. The injection of the carriers causes a trapped plasma to occur in region 16 of the carrier injected avalanche device 10, whereby the device 10 switches to a low impedance state. Since forwardly-biased injection laser 22 also exhibits a low impedance, charge supply circuit 20 dissipates its stored charge through serially connected injection laser 22 and device 10, resulting in a current pulse 36 therethrough. Current pulse 36 is of sufficient magnitude to pump injection laser 22 above its lasing threshold, causing injection laser 22 to emit a pulse of coherent light 23 from the optical resonant cavity portion of laser 22, existing in the vicinity of the PN junction device of laser 22.

The dissipation of the charge stored in charge supply circuit 20 by the current pulse 36 causes the magnitude of the voltage 34 across carrier injected avalanche device 10 to fall below that level which is required to sustain avalanche breakdown in device 10. Thus, carrier injected avalanche device 10 switches back to its high impedance state, thereby extinguishing the current pulse. Current pulse 36 has been achieved with a magnitude of about 8 amperes with, as noted above, a duration as short as one nanosecond.

The waveform of voltage 34 across device 10 is shown in FIG. 2. Again, it is noted that from a maximum voltage $V^+$, at the time of carrier injection, the voltage drops to near zero level as the charge stored in capacitor 24 is dissipated to generate current pulse 36. Before the next input pulse 30 can trigger breakdown in device 10, the voltage 34, as controlled by the charge in capacitor 24, must recover to a magnitude just below the breakdown level for the triggering of the plasma. The period required for such recovery determines the maximum repetition period. It was believed prior to the present invention that such recovery time was solely the function of the charging periods of charge supply circuit 20. Accordingly, it had been thought that, by employing charging circuitry more sophisticated than resistor 26, incorporating some devices to short-out, in effect, the charging resistance during the recovery period, capacitor 24 could be repetitively charged to a required level, such as $10^{-8}$ coulombs, and discharged at a repetition rate up to 500 MHz. However, it has been discovered that a dead period, generally indicated as 38 on the waveform of of voltage 34 (FIG. 2) exists wherein the voltage across device 10 remains near zero level, before the capacitor 24 begins to recharge through resistor 26. Such dead periods 28 have been found to be of a duration as long as 100 nanoseconds. It has been discovered that the recovery time is not merely a function of the charging period of charge supply circuit 20, but is also dependent upon the duration of dead period 38. Thus, dead period 38 limits the maximum repetition rate of the prior art injection laser modulator of FIG. 1.

The present invention is directed to a technique for eliminating such dead period 38 to allow thereby operation of an injection laser modulator at a high repetition rate.

It has been discovered that the dead period occurs because the existence of plasma current pulse 36 effects a large forward-bias at control junction 19. Accordingly, holes generally indicated as 38, accumulate on the $P^+$ side of control junction 19 and electrons, generally indicated as 40, accumulate at the $N^{++}$ side of junction 19. Even after the plasma current stops, as the charge built-up in capacitor 24 is dissipated, the accumulated electrons 40 and holes 38 remain at control junction 19, and slowly or gradually dissipate through resistor 32 to ground. During the dissipation period control junction 19 is forward-biased, thus the $N^+-P^+-N-N^+$ structure behaves as a transistor in a conduction state. Accordingly, a saturation current of approximately 100 milliamperes exists, and the voltage across the device 10 is held at near zero volts.

FIG. 3 is a schematic of a high repetition rate pulse generator in accordance with the present invention. Elements that are the same as elements of the prior art injection laser modulator depicted in FIG. 1 are denoted with the same numerals. A carrier injected avalanche device 10 having respective layers 12, 14, 16 and 18 and a control junction 19 is connected at layer 18 through a forwardly-poled injection laser 22 to a suitable charge supply circuit 20. Layer 12 of the device is connected to ground. A pulse generator 28a provides pulses 30a through a blocking capacitor 35 across resistor 32 and a biasing source 36, which are in turn connected across control junction 19. Pulse 30a is of sufficient magnitude to overcome the negative bias offset voltage of biasing source 37 and to inject sufficient carriers into device 10 to trigger a trapped plasma in the device. For example, as illustrated in FIG. 4, the pulse 30a would have a magnitude 0.6 volts greater than the magnitude $V_{offset}$ of biasing source 37.

The operation of the pulse generator of FIG. 3 is now addressed with reference to FIGS. 3 and 4. As in the prior art, carrier injected avalanche device 10 remains in a high impedance state, despite the presence of bias voltage 34 from charge supply circuit 20, until carriers are injected into device 10 as by pulses 30a. The injection of the carriers triggers a trapped plasma in N layer 16 of device 10, thereby switching device 10 to a low impedance state. The charge accumulated in capacitor 24 dissipates, as in the prior art device, in current pulses through laser 22 and device 10. The current pulses are denoted in FIG. 4 as 36a. With the dissipation of the charge stored in capacitor 24, the instantaneous magnitude of voltage 34a across carrier injected avalanche device 10 is insufficient to maintain the trapped plasma and, accordingly, device 10 switches back to its high impedance state.

As in the prior art, the plasma current within device 10 causes electrons 40 and holes 38 to accumulate across control junction 19. Such a charge accumulation, however, in accordance with the present invention is quickly depleted by an electric field created by biasing source 37. That is, the negative offset voltage of biasing source 37 quickly pulls the accumulated electrons 40 and holes 38 from control junction 19 and substantially instantaneously dissipates the charges through resistor 32 to ground. Thus, in accordance with the present invention, biasing source 37 prevents control junction 19 from being forward-biased for any substantial period of time and the dead period 38 of the prior art is reduced to substantially zero. Accordingly, when device 10 switches back to its high impedance state, current pulse 36a is extinguished completely, and capacitor 24 immediately begins to recharge. Blocking capacitor 34 serves to isolate pulse generator 28a from the d.c. signal generated by bias source 37.

It should be apparent from the foregoing description of the preferred embodiment that the present invention provides a particularly advantageous injected carrier avalanche device pulse generator in that elimination of the dead period inherent in the operation of the prior art systems provides for operation at extremely high repetition rates. A pulse generator in accordance with the present invention has been implemented to generate 8 ampere pulses of one nanosecond duration with a repetition rate of 10 M bits/sec, as opposed to a maximum bit rate of 4 M bits/sec with the pulse generator of FIG. 1. This is accomplished by providing a biasing voltage across the control junction of the carrier injected avalanche device to quickly dissipate the charge accumulation created across the device control junction by the avalanche plasma current to thereby eliminate such dead period.

It will be understood that the above description of an illustrative embodiment of the present invention, and that the invention is not limited to the specific form shown. For example, it should be appreciated that the carrier injected avalanche device pulse generation can be used for any application of high speed, high power switching.

What is claimed is:

1. In a pulse generator of the type including a carrier injected avalanche device having a control junction, said avalanche device being connected to charge storing means for dischargeably accumulating a charge to thereby reverse bias said avalanche device to a bias level establishing an electric field within said avalanche device having a magnitude substantially equal to but not exceeding the critical magnitude of electric field required to cause a trapped plasma in said avalanche device, means for injecting carriers into said avalanche device at said control junction to thereby increase the magnitude of said electric field in said avalanche device to exceed said critical magnitude and thus cause a trapped plasma in said device, said avalanche device being normally in a high impedance state but in a low impedance state during avalanche breakdown, said charge storing means discharging said charge as a current pulse through said device in response to said trapped plasma, said avalanche device resuming a high impedance state after the discharge of said charge, said current pulse causing carriers to accumulate across said control junction, thereby forward biasing said junction until the depletion of said carrier accumulation; the improvement therewith comprising:

biasing means, connected across said control junction, for reverse biasing said control junction to thereby substantially instantaneously deplete said carrier accumulation.

2. The pulse generator of claim 1, wherein said means for injecting carriers injects said carrier at a given maximum rate.

3. The pulse generator of claim 2, wherein the period between respective injections at said maximum rate is insufficient, absent said biasing means, to allow depletion of said carrier accumulation.

* * * * *